United States Patent
Winslow et al.

(10) Patent No.: US 12,212,305 B2
(45) Date of Patent: Jan. 28, 2025

(54) SEMICONDUCTOR DEVICE AND METHOD OF FORMING HIGH $K_T^2$ HIGH Q ACOUSTIC WAVE RESONATOR

(71) Applicant: MACOM Technology Solutions Holdings, Inc., Lowell, MA (US)

(72) Inventors: Thomas A. Winslow, Salem, VA (US); Rathnait Long, North Andover, MA (US); Mihir S. Patel, Hopkinton, MA (US); Douglas J. Carlson, Hopkinton, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 290 days.

(21) Appl. No.: 17/804,916

(22) Filed: Jun. 1, 2022

(65) Prior Publication Data
US 2023/0396234 A1    Dec. 7, 2023

(51) Int. Cl.
*H03H 9/25*    (2006.01)
*H03H 3/08*    (2006.01)

(52) U.S. Cl.
CPC ............... *H03H 9/25* (2013.01); *H03H 3/08* (2013.01)

(58) Field of Classification Search
CPC ............ H03H 9/25; H03H 3/08; H03H 9/172; H03H 9/173; H03H 9/175;
(Continued)

(56) References Cited

U.S. PATENT DOCUMENTS

| 5,903,087 A | 5/1999 | Mattson et al. |
| 2006/0255682 A1 | 11/2006 | Huang et al. |

(Continued)

OTHER PUBLICATIONS

Avanish Bhadauria et al., "Enhancing Q-Factor Using Fractal Electrodes in Film Bulk Acoustic Resonator for Wireless Applications", Proceedings of the Asia-Pacific Microwave Conference, 6 pages, Dec. 2016.

(Continued)

*Primary Examiner* — Andrea Lindgren Baltzell
*Assistant Examiner* — Kimberly E Glenn
(74) *Attorney, Agent, or Firm* — Robert D. Atkins; PATENT LAW GROUP

(57) ABSTRACT

An acoustic wave resonator has a first conductive layer, piezoelectrical material formed over the first conductive layer, and second conductive layer formed over the piezoelectric material. An alignment of the first conductive layer, piezoelectric material and second conductive area defines an active region of the resonator and the active region includes a core area and a plurality of fractals extending from or recessed into the core area. The fractals maximize a perimeter-to-area ratio of the active region of the resonator. The fractals increase electromechanical coupling and a quality factor of the resonator. The fractals can have a star shape, rounded shape, asymmetric shape, or other shape that optimizes the perimeter-to-area ratio of the active region to maximize performance of the resonator. A frame can be
(Continued)

disposed over or within the piezoelectric material. The frame is raised above the second conductive layer or recessed below the second conductive layer.

20 Claims, 14 Drawing Sheets

(58) Field of Classification Search
CPC ....... H03H 2003/0442; H03H 9/02157; H03H 9/14544; H03H 9/177; H03H 9/132
See application file for complete search history.

(56) References Cited

U.S. PATENT DOCUMENTS

| | | | |
|---|---|---|---|
| 2013/0314177 A1 | 11/2013 | Burak et al. | |
| 2014/0118087 A1* | 5/2014 | Burak .................... | H03H 9/171 333/186 |
| 2019/0089327 A1* | 3/2019 | Campanella-Pineda .................... | H03H 9/54 |

OTHER PUBLICATIONS

Benjamin Y. Park et al., "A Case for Fractal Electrodes in Electrochemical Applications", Journal of the Electrochemical Society, 154(2), p. 1-p. 5, 2007, available electronically Dec. 6, 2006.

Jin Ding et al., "Simultaneous realization of slow and fast acoustic waves using a fractal structure of Koch curve", Scientific Reports, 8:1481, p. 1-p. 7, 2018, published online Jan. 24, 2018.

Jordi Verdu Tirado (Ph.D. Dissertation), "Bulk Acoustic Wave Resonators and their Application to Microwave Devices", Universitat Autonoma de Barcelona, Department de Telecomunicaions i d'Enginyeria de Sistemes, 201 pages, Jun. 2010.

Stefan Wagner (Master Thesis), "Novel Micromechanical Bulk Acoustic Wave Resonator Sensing Concepts for Advanced Atomic Force Microscopy", KTH Vetenskap Och Konst, KTH Electrical Engineering, 87 pages, 2012 (no month of publication available).

Xianfeng Man et al., "Hilbert fractal acoustic metamaterials with negative mass density and bulk modulus on subwavelength scale", Materials and Design, 180, 15 pages, available online Jun. 1, 2019.

Yu Liu et al., "Fractal Acoustic Metamaterials with Subwavelength and Broadband Sound Insulation", Hindawi, Shock and vibration, vol. 2019, 7 pages, Jun. 12, 2019.

* cited by examiner

US 12,212,305 B2

SEMICONDUCTOR DEVICE AND METHOD OF FORMING HIGH $K_T^2$ HIGH Q ACOUSTIC WAVE RESONATOR

FIELD OF THE INVENTION

The present invention relates in general to semiconductor devices and, more particularly, to a semiconductor device and method of forming an acoustic wave resonator with high $K_T^2$ and high Q.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and oxide semiconductor field effect transistor (MOSFET). Integrated semiconductor devices typically contain hundreds to millions of electrical components. Examples of integrated semiconductor devices include microcontrollers, microprocessors, and various analog and digital circuits.

Semiconductor devices perform a wide range of functions, such as signal conversion, signal processing, high-speed calculations, transmitting and receiving electromagnetic signals, controlling electronic devices, transforming sunlight to electricity, and power amplification. Semiconductor devices are found in the fields of communications, power conversion, networks, computers, audio/video, and consumer products. Semiconductor devices are also found in military applications, aerospace, aviation, automotive, office equipment, and industrial, scientific, and medical (ISM) controllers.

One type of semiconductor device is an acoustic wave resonator, either as a surface acoustic wave (SAW) resonator or bulk acoustic wave (BAW) resonator. An acoustic wave resonator converts an electrical signal to a mechanical activity or signal, or mechanical activity or signal to an electrical signal. Acoustic wave resonators use a class of semiconductor material exhibiting piezoelectric properties.

FIG. 1a is a simplified stacked structure of a common acoustic wave resonator 10, with bottom conductive layer 12, intermediate piezoelectric material 14, and top conductive layer 16. FIG. 1B is an example top view of acoustic wave resonator 10. The external contact for bottom conductive layer 12 enters from the left and extends under piezoelectric material 14. The external contact for top conductive layer 16 enters from the right and extends over piezoelectric material 14. The portion of top conductive layer 16 over piezoelectric material 14 is hidden to show the relevant physical shape of the piezoelectric material. Bottom conductive layer 12, intermediate piezoelectric material 14, and top conductive layer 16 reside within an acoustic cavity. For film bulk acoustic wave resonators (FBAR), air gaps need to exist below conductive layer 12 and above conductive layer 16 to create impedance mismatches and contain the acoustic wave, as much as possible, within the acoustic cavity. Vias or holes 20 provide a path to form the airgap below conductive layer 12. For solidly mounted resonators (SMR), the lower acoustic cavity is formed by a series of layers which form a Bragg reflector.

The performance of acoustic wave resonator 10 can be expressed as a series resonance $F_S$ and parallel resonance $F_P$. FIG. 2 illustrates curve 40 as a graph of admittance versus frequency for acoustic wave resonator 10. Acoustic wave resonator 10 has a peak in the frequency curve at frequency 42, referred to as the series resonance $F_S$, and a minimum in the frequency curve at frequency 44, referred to as parallel resonance $F_P$. The frequency response of acoustic wave resonator 10 is in part a function of the type of material, shape, and overall thickness of the device, i.e., bottom conductive layer, piezoelectric material, and top conductive layer. The difference in frequency between series resonance $F_S$ and parallel resonance $F_P$ (frequency 44 – frequency 42) is referred to as the electromechanical coupling strength of acoustic wave resonator 10, or simply $K_T^2$, as the admittance curve in equation (1).

$$K_T^2 = ((\pi/2)*(F_S/F_P))/\tan(((\pi/2)*(F_S/F_P))) \qquad (1)$$

$K_T^2$ represents the ability or efficiency of an acoustic wave resonator to convert electrical and mechanical signals. $K_T^2$ can be expressed as a percentage, with higher values being preferable.

Given the basic implementation of acoustic wave resonator 10, i.e., piezoelectric material (with dielectric properties) between two conductive layers, the device exhibits a capacitance. FIG. 3 illustrates a graph of capacitance versus frequency for acoustic wave resonator 10. Curve 50 shows capacitance increasing with frequency starting about frequency 52 with a peak at frequency 54, followed by the capacitance decreasing with frequency until leveling off about frequency 58. The smoothness of the resonance response, e.g., between frequency 52 and frequency 54, is a measure of the quality or Q of acoustic wave resonator 10. A preferable higher Q corresponds to less spurious resonances and no ripples.

Acoustic wave resonator 10 in FIGS. 1a-1b is commonly referred to as apodized type design with piezoelectric material 14 formed to shapes such as ovals and pentagons shape (5-sided, example of which is shown in FIG. 1B). The sides of pentagon-shaped piezoelectric material 14 are not parallel. In one example, piezoelectric material 14 in acoustic wave resonator 10 has, including but not limited to, a perimeter of 1155 micrometers (µm), as the sum of the length of each of the five sides, and an area of 90,000 mm$^2$.

The $K_T^2$ property is a function of materials, resonator stack configuration and height, and the perimeter-to-area ratio of piezoelectric material 14. Q-factor of the resonator is primarily dependent on the stack materials properties, mode of operation, and resonator design to confine the operational mode energy in the active region.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 4:
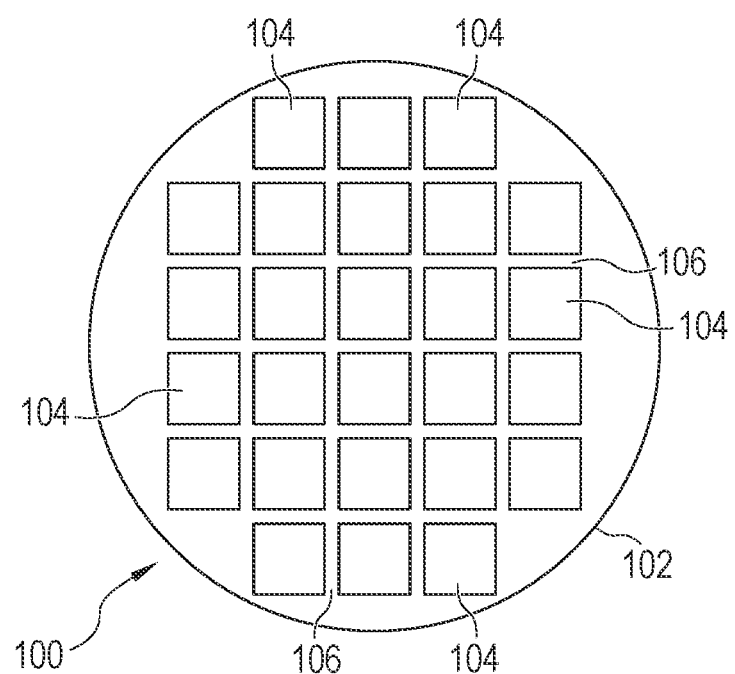
FIG. 4 illustrates a semiconductor wafer with a plurality of semiconductor die.

FIG. 4 shows semiconductor wafer or substrate 100 with a base substrate material 102, such as silicon (Si), silicon carbide (SiC), germanium, aluminum phosphide, aluminum arsenide, gallium arsenide, gallium nitride, indium phosphide, or other semiconductor materials for structural support. Alternatively, substrate material 102 can be glass, single crystalline, polycrystalline or amorphous crystal structure, or other ceramic material compatible with material processing for electronic devices. A plurality of semiconductor die or components 104 is formed on wafer 100 separated by a non-active, inter-die wafer area or street 106. Street 106 provides cutting areas to singulate semiconductor wafer 100 into individual semiconductor die 104. In one embodiment, semiconductor wafer 100 has a width or diameter of 100-450 millimeters (mm). In the present embodiment, semiconductor die 104 contains an acoustic wave resonator.

Figure 5A:
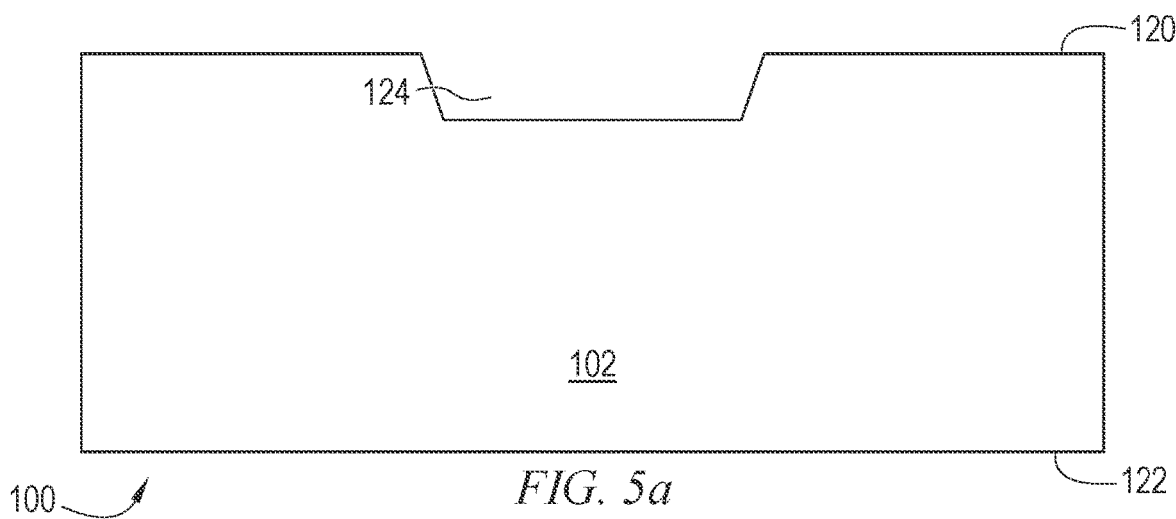
FIGS. 5a-5e illustrate a process of forming a FBAR acoustic wave resonator having piezoelectrical material with a plurality of fractals to optimize the perimeter-to-area ratio.

FIG. 5a illustrates a portion of semiconductor wafer or substrate 100 from FIG. 1 containing base semiconductor material 102. Substrate 100 includes major surface 120 and major surface 122 opposite surface 120. Elements in the figures having a similar function are assigned the same reference number. Substrate 100 is patterned to isolate unintended areas and then etched to remove a portion of base substrate material 102 and form trench 124. In one embodiment, base substrate material 102 is removed by a selective wet chemical etching process through a patterned photoresist layer, to form trench 124. Alternatively, a portion of base substrate material 102 is removed by laser direct ablation (LDA) to form trench 124. In another embodiment, a conformal layer is formed (so no trench is initially formed) and later taken away using a vapor etch into the holes.

Figure 5B:
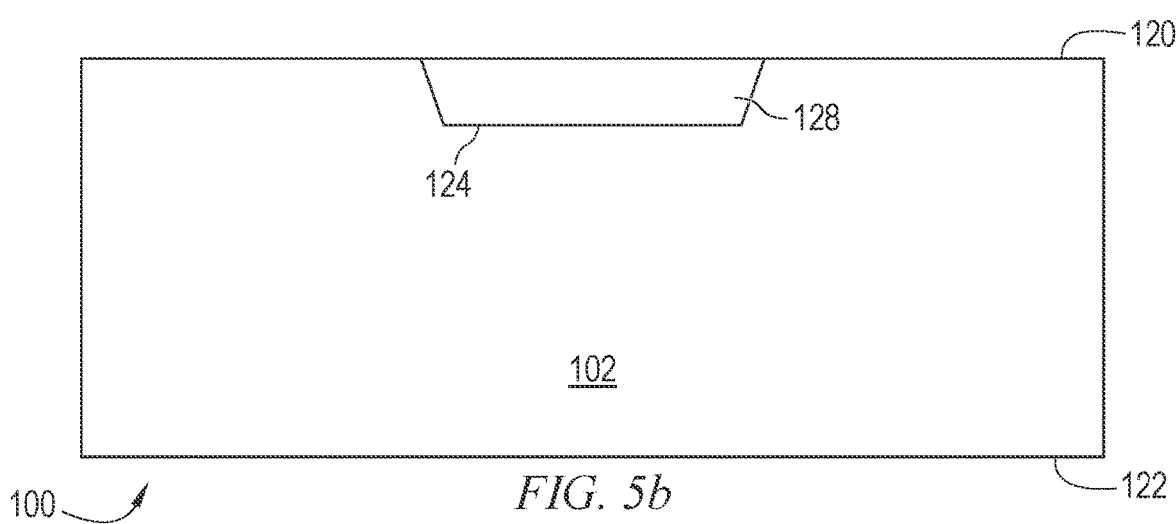

In FIG. 5b, a temporary, sacrificial material 128 is deposited in trench 124 to provide support in forming the next insulating layer.

Figure 5C:
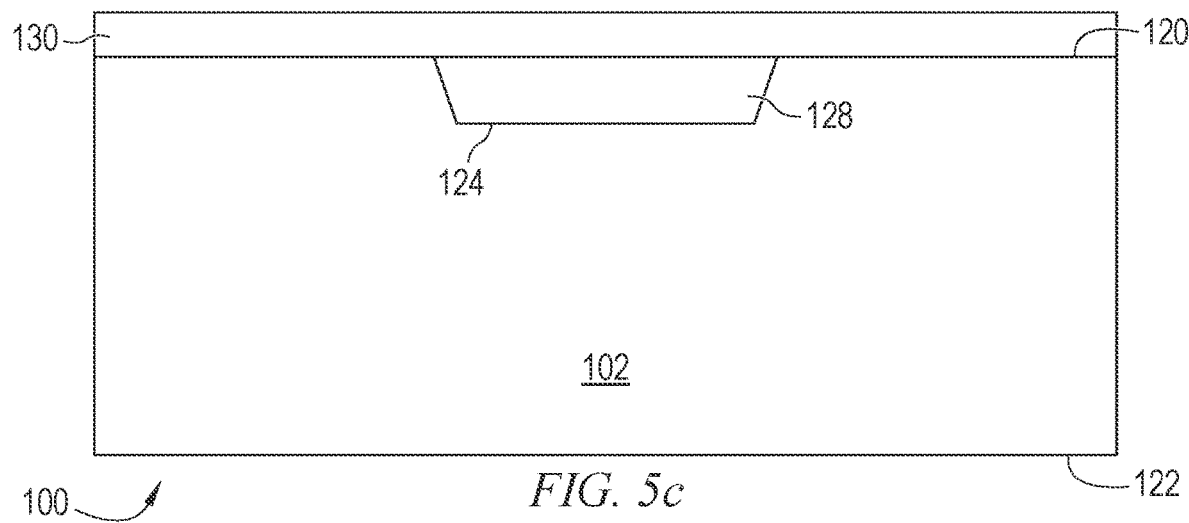

In FIG. 5c, an insulating or passivation layer 130 is formed over surface 120 of substrate 100 and sacrificial material 128 using PVD, CVD, printing, spin coating, spray coating, sintering or thermal oxidation. The insulating layer 130 may contain, but is not limited to, one or more layers of silicon dioxide (SiO2), silicon nitride (Si3N4), silicon oxynitride (SiON), tantalum pentoxide (Ta2O5), aluminum oxide (Al2O3), or other material having similar structural and insulating properties. Insulating layer 130 provides support and isolation for the later formed piezoelectric material.

Figure 5D:
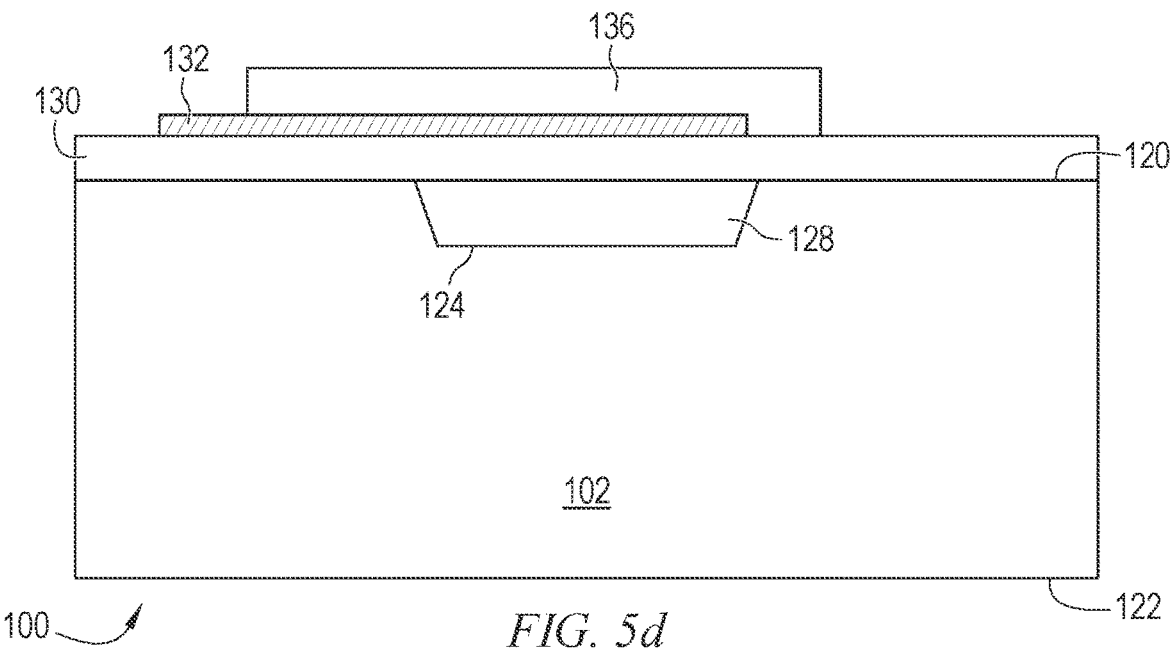

In FIG. 5d, an electrically conductive layer 132 is formed in contact with insulating layer 130 using PVD, CVD, evaporation, electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as a contact for the acoustic wave resonator.

A piezoelectric material 136 is formed over conductive layer 132 and insulating layer 130 using PVD, CVD, sputtering, or other suitable deposition process. Piezoelectric material 136 contains one or more layers of aluminum or aluminium nitride, zinc oxide, lead zirconate titanate, quartz, gallium arsenide, lithium niobate, or any other reactive material with similar physical and electrical properties. In one embodiment, piezoelectric material 136 is deposited as a thin film, followed by an anneal.

Figure 5E:
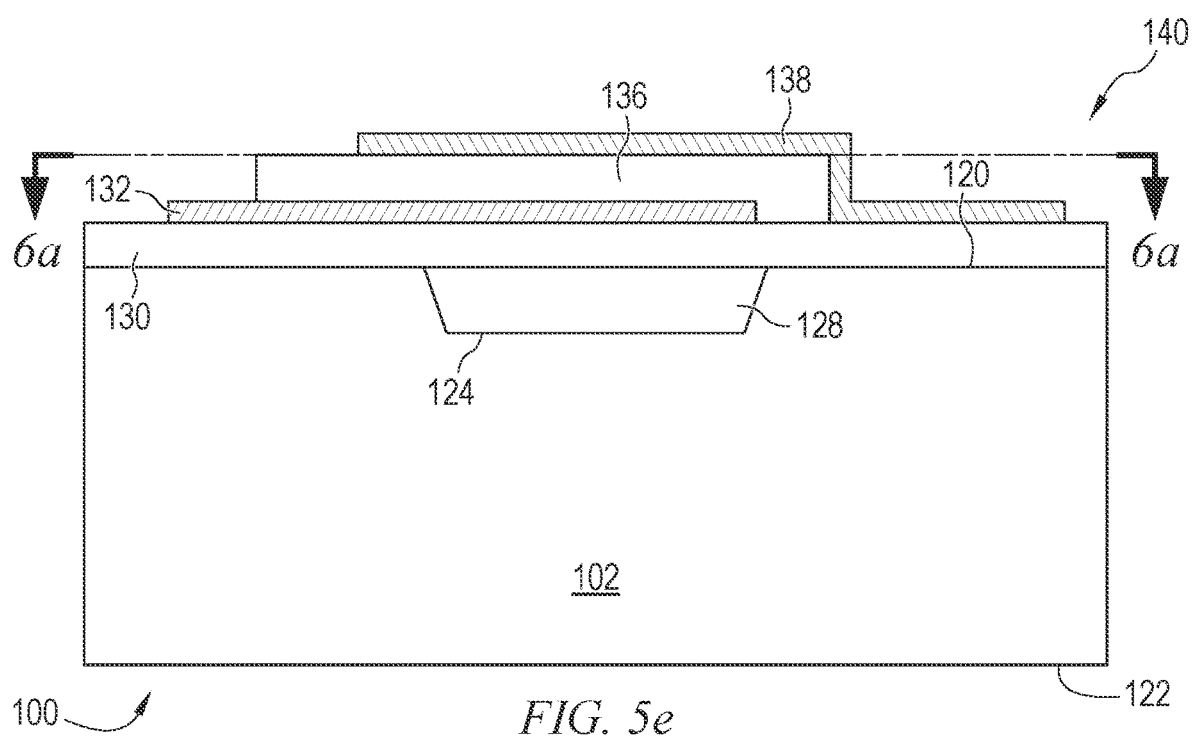

In FIG. 5e, an electrically conductive layer 138 is formed in contact with piezoelectric material 136 and insulating layer 130 using PVD, CVD, evaporation, electrolytic plating, electroless plating process, or other suitable metal deposition process. Conductive layer 138 can be one or more layers of Al, Cu, Sn, Ni, Au, Ag, or other suitable electrically conductive material. An insulating layer can be formed over conductive layer 138. The combination of conductive layer 132, piezoelectric material 136, and conductive layer 138 operate as acoustic wave resonator 140 converting an electrical signal to a mechanical activity or signal, or mechanical activity or signal to an electrical signal. In one embodiment, as shown in FIG. 5e, acoustic wave resonator 140 is a film bulk acoustic wave resonance BAW resonator.

Figure 6A:
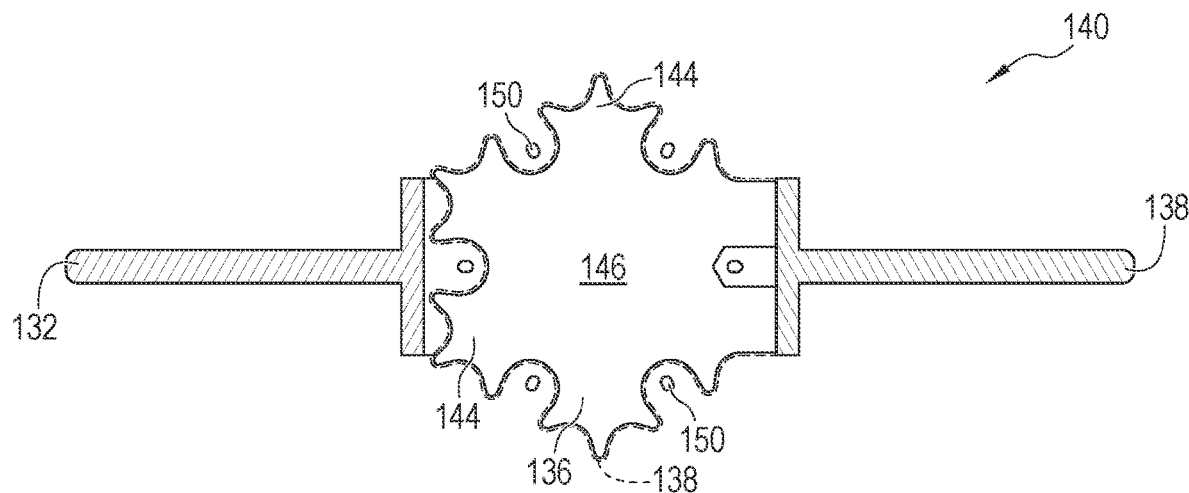
FIGS. 6a-6e illustrate the top conductive layer, piezoelectric material, and bottom conductive layer patterned with fractals.

FIG. 6a is a top view of acoustic wave resonator 140. The external contact for conductive layer 132 enters from the left and extends under piezoelectric material 136. The external contact for top conductive layer 138 enters from the right and extends over piezoelectric material 136. The portion of top conductive layer 138 over piezoelectric material 136 is hidden to show the relevant physical shape of the piezoelectric material. The active portion of acoustic wave resonator 140 is the area where conductive layer 132, piezoelectric material 136, and conductive layer 138 all overlap in vertical alignment.

In particular, one or more of the elements of acoustic wave resonator 140 are shown with fractal shapes 144 around central body region 146 to increase the perimeter-to-area ratio of the acoustic wave resonator 140. Fractals 144 are extensions or protrusions extending from central body region 146 and can have a variety of shapes, geometries, angles, forms, counts, positions, with each fractal intending to increase or maximize the perimeter-to-area ratio of the active portion of acoustic wave resonator 140. For example, fractals 144 can be star-shaped, pointed-extensions, rounded-extensions, bumps, leaf-shaped, symmetrical, asymmetrical, or any shape that that maximizes the perimeter-to-area ratio, while maintaining a solid and continuous electrode shape, which provides an electrode boundary composed of segments that maximize the number of non-parallel edges. Fractals 144 can vary in geometry, angle, shape, size, form, area, and ratio of fractal area to core area.

Bottom conductive layer 132, intermediate piezoelectric material 136, and top conductive layer 138 reside within an acoustic cavity. For FBAR devices, air gaps need to exist below conductive layer 132 and above conductive layer 138 to create impedance mismatches and contain the acoustic wave, as much as possible, within the acoustic cavity. Vias or holes 150 provide a path to remove sacrificial material 128 and form an airgap below conductive layer 132 in trench 124. Acoustic wave resonator 140 is applicable to radio frequency (RF) filters, temperature sensors, pressure sensors, oscillators, bio sensors, chemical sensor, infrared (IR) sensors, and gyroscopes.

Figure 6B:
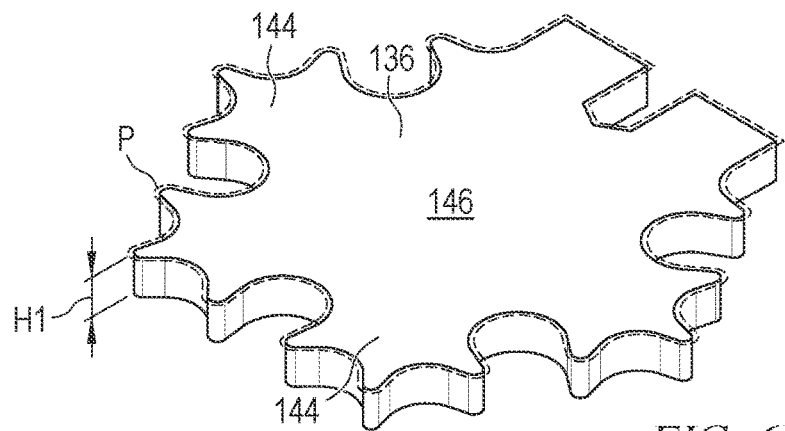

In one embodiment, the performance of acoustic wave resonator 140 (in part, maximizing $K_T^2$ and Q) is achieved by patterning piezoelectric material 136 with fractals 144. FIG. 6b is a perspective view of piezoelectric material 136 in isolation including central body region 146 and fractals 144 extending from the central body region. Piezoelectric material 136 may have, including but not limited to, a height H1 of 2.0 μm and perimeter P of 2112 μm, including the distance around each feature or pattern of fractals 144 and core area 146. The value of H1 and P will vary depending on the design and application.

In general, fractal 144 is an extension from central body region 146 with detail of a fine structure on a small scale. Fractal 144 can be symmetrical or asymmetric with irregular geometric forms. Fractal 144 can exhibit self-similarity, in an approximate or statistical sense. Fractal 144 has a fractal dimension, greater than its topological dimension. Fractal 144 can be defined in a recursive manner.

In one embodiment, conductive layer 138 and piezoelectric material 136 has a perimeter P as the distance around each feature or pattern of fractals 144 and core area 146, and similar area as piezoelectric material 14, as described in the background. The perimeter of conductive layer 138 and piezoelectric material 136 is greater and the area is similar, as compared to piezoelectrical material 14. Consequently, the perimeter-to-area ratio of conductive layer 138 and piezoelectric material 136 has been, through the use of fractals, optimized to maximize $K_T^2$ and Q. In one embodiment, the greater perimeter-to-area ratio of conductive layer 138 and piezoelectric material 136, the greater $K_T^2$, higher Q, less spurious resonances, which improves the operational efficiency of acoustic wave resonator 140. Acoustic wave resonator 140 can achieve, including but not limited to, $K_T^2$ of 10-15%. The value of $K_T^2$ and Q will vary depending on the design and application.

Figure 6C:
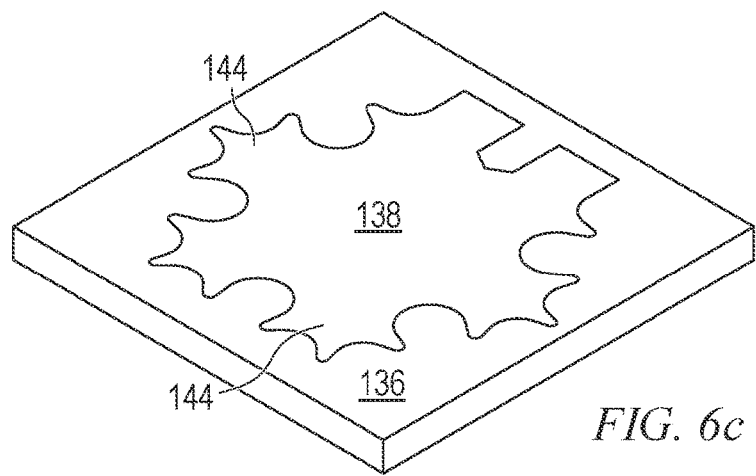

In another embodiment, the performance of acoustic wave resonator 140 (in part, maximizing $K_T^2$ and Q) is achieved by patterning conductive layer 138 with fractals 144. FIG. 6c is a perspective view of conductive layer 138 including central body region 146 and fractals 144 extending from the central body region disposed over piezoelectrical material 136. Piezoelectric material 136 can have any shape, e.g., rectangular, with an area greater than the area of conductive layer 138. Recall that the active portion of acoustic wave resonator 140 is the area where conductive layer 132, piezoelectric material 136, and conductive layer 138 all overlap in vertical alignment. In this case, the fractal patterned conductive layer 138 alone controls the enhanced performance of acoustic wave resonator 140.

Figure 6D:
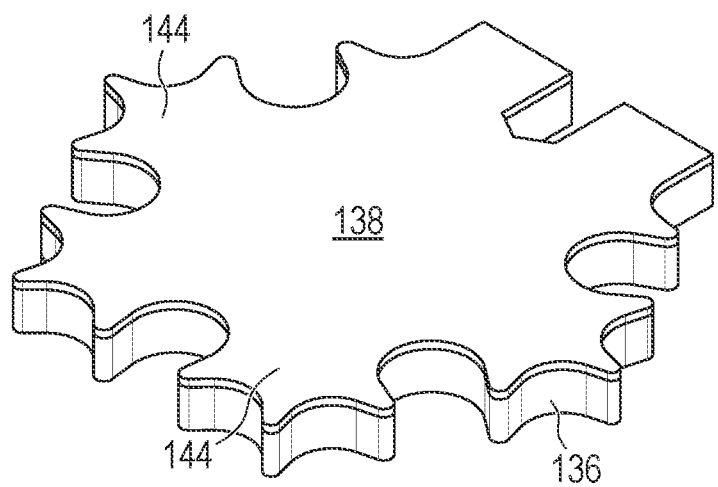

In another embodiment, the performance of acoustic wave resonator 140 (in part, maximizing $K_T^2$ and Q) is achieved by patterning piezoelectric material 136 and conductive layer 138 with fractals 144. FIG. 6d is a perspective view of conductive layer 138 including central body region 146 and fractals 144 extending from the central body region disposed over similarly patterned piezoelectrical material 136. In this case, the fractal patterned piezoelectric material 136 and conductive layer 138 together control the enhanced performance of acoustic wave resonator 140.

Figure 6E:
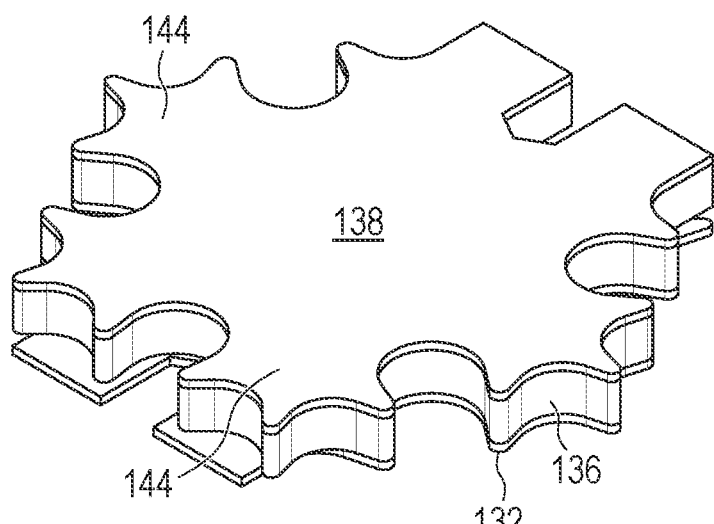

In another embodiment, the performance of acoustic wave resonator 140 (in part, maximizing $K_T^2$ and Q) is achieved by patterning conductive layer 132, piezoelectric material 136, and conductive layer 138 with fractals 144. FIG. 6e is a perspective view of conductive layer 138 including central body region 146 and fractals 144 extending from the central body region disposed over similarly patterned piezoelectrical material 136 and conductive layer 132. In this case, the fractal patterned conductive layer 132, piezoelectric material 136, and conductive layer 138 together control the enhanced performance of acoustic wave resonator 140.

In the examples of FIG. 6a-6e, the enhanced performance of acoustic wave resonator 140 (in part, maximizing $K_T^2$ and Q) can be achieved by patterning conductive layer 132, piezoelectric material 136, and/or conductive layer 138 with fractals 144. By nature of the active portion of acoustic wave resonator 140 being the area where conductive layer 132, piezoelectric material 136, and conductive layer 138 all overlap in vertical alignment, fractals 144 can be patterned in conductive layer 132, or conductive layer 138, or piezoelectric material 136, or any combination of these layers, including all three layers.

Figure 7A:
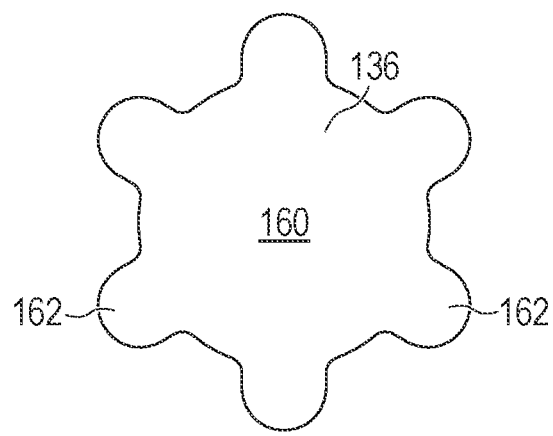
FIGS. 7a-7d illustrate embodiments of the piezoelectric material with various fractal extensions and recessions.

FIGS. 7a-7d illustrate example alternate shapes for piezoelectric material 136. In FIG. 7a, piezoelectric material 136 has core area 160 and a plurality of rounded fractals 162 extending from the core area. In this case, the perimeter of piezoelectric material 136 is the distance around each feature or pattern of fractals 162 and core area 160. The same shape can be used for conductive layer 132 and/or conductive layer 138. Fractals 162 increase the perimeter-to-area ratio of the active portion of acoustic wave resonator 140 to enhance its performance by maximizing $K_T^2$ and Q.

Figure 7B:
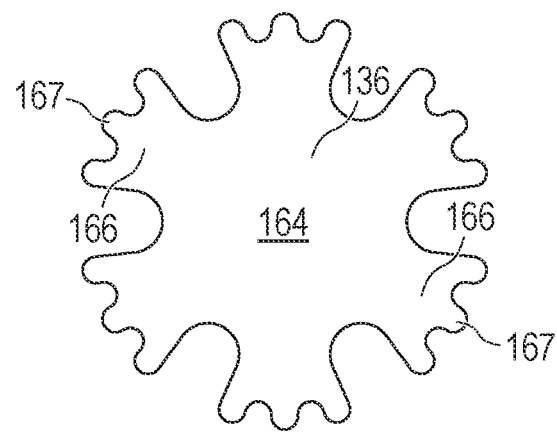

In FIG. 7b, piezoelectric material 136 has core area 164 and a plurality of fractals 166 extending from the core area and rounded bumps 167 on the fractals. In this case, the perimeter of the active portion of acoustic wave resonator 140 is the distance around each feature or pattern of fractals 166-167 and core area 164. The same shape can be used for conductive layer 132 and/or conductive layer 138. Fractals 166 increase the perimeter-to-area ratio of the active portion of acoustic wave resonator 140 to enhance its performance by maximizing $K_T^2$ and Q.

Figure 7C:
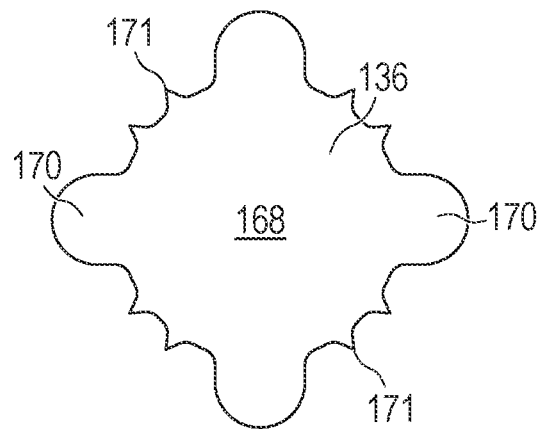

In FIG. 7c, piezoelectric material 136 has core area 168 and a plurality of irregular or asymmetrical fractals 170 and 171 extending from the core area. In this case, the perimeter of the active portion of acoustic wave resonator 140 is the distance around each feature or pattern of fractals 170-171 and core area 168. Fractals 170-171 can have a variety of shapes and sizes, e.g., rounded, rounded with bumps, pointed, etc. The same shape can be used for conductive layer 132 and/or conductive layer 138. Fractals 170-171 increase the perimeter-to-area ratio of the active portion of acoustic wave resonator 140 to enhance its performance by maximizing $K_T^2$ and Q.

Figure 7D:
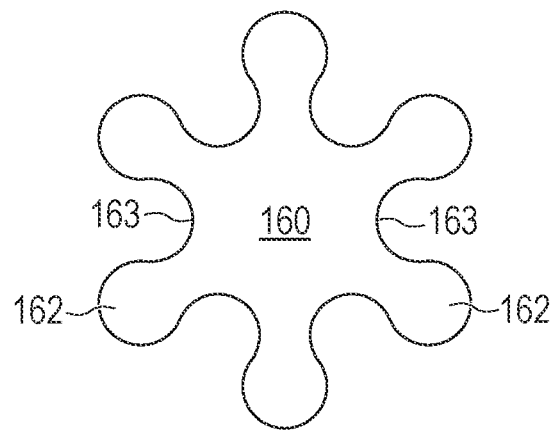

In FIG. 7d, piezoelectric material 136 has core area 172 and a plurality of irregular or asymmetrical fractals 173 extending from the core area and a plurality of irregular or asymmetrical fractals 174 recessed into the core area. In this case, the perimeter of the active portion of acoustic wave resonator 140 is the distance around each feature or pattern of fractals 173-174 and core area 172. Fractals 173-174 can have a variety of shapes and sizes, e.g., rounded, rounded with bumps, pointed, etc. The same shape can be used for conductive layers 132 and 138. Fractals 173-174 may decrease the perimeter-to-area ratio of the active portion of acoustic wave resonator 140 to enhance its performance by maximizing $K_T^2$ and Q.

In general, the patterned feature of acoustic wave resonator 140, i.e., conductive layer 132, piezoelectric material 136, and/or conductive layer 138, should have a central core with fractals extending outward from around the core or recessing inward into the core to increase or decrease the perimeter-to-area ratio of the active portion of acoustic wave resonator 140 to enhance its performance by maximizing $K_T^2$ and Q. Fractals can vary in geometry, angle, shape, size, form, area, and ratio of fractal area to core area. Fractals can vary in the number of extensions or protrusions or recesses and positions around core area. Fractals can have a combination of recessed and raised frames to optimize the perimeter-to-area ratio of the active portion of acoustic wave resonator 140 to enhance its performance by maximizing $K_T^2$ and Q. The purpose of the fractal shape is to provide a high scattering boundary to break up the edges of the piezoelectric material and make the geometry more diffuse and deflect horizontal waves. The fractals reduce or negate the effect of horizontal waves superimposing on themselves to become larger parasitic modes of the resonator, e.g., bouncing back and forth between the walls of the resonator, which is undesirable.

In another embodiment, piezoelectric material 136 can be expanded three dimensionally, e.g., by roughening or shaping the material to create z-direction features, such as waves in the top surface of the piezoelectric material, prior to forming conductive layer 138. Piezoelectric material 136 can have an internal perimeter, as well as an external perimeter, to increase the effective perimeter of the device. Piezoelectric material 136 can have internal cavities, as a swiss cheese effect, to increase the effective perimeter of the device.

Figure 1A:
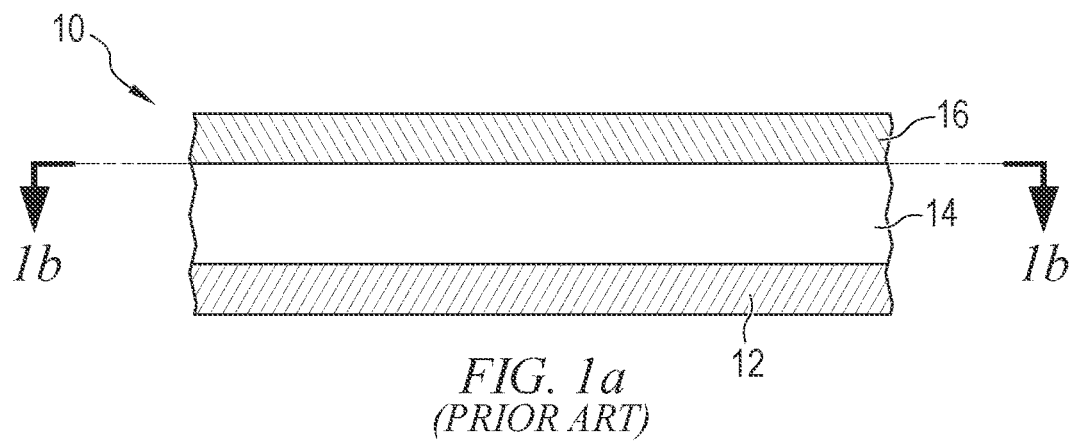
FIGS. 1a-1b illustrate an example acoustic wave resonator.
Figure 1B:
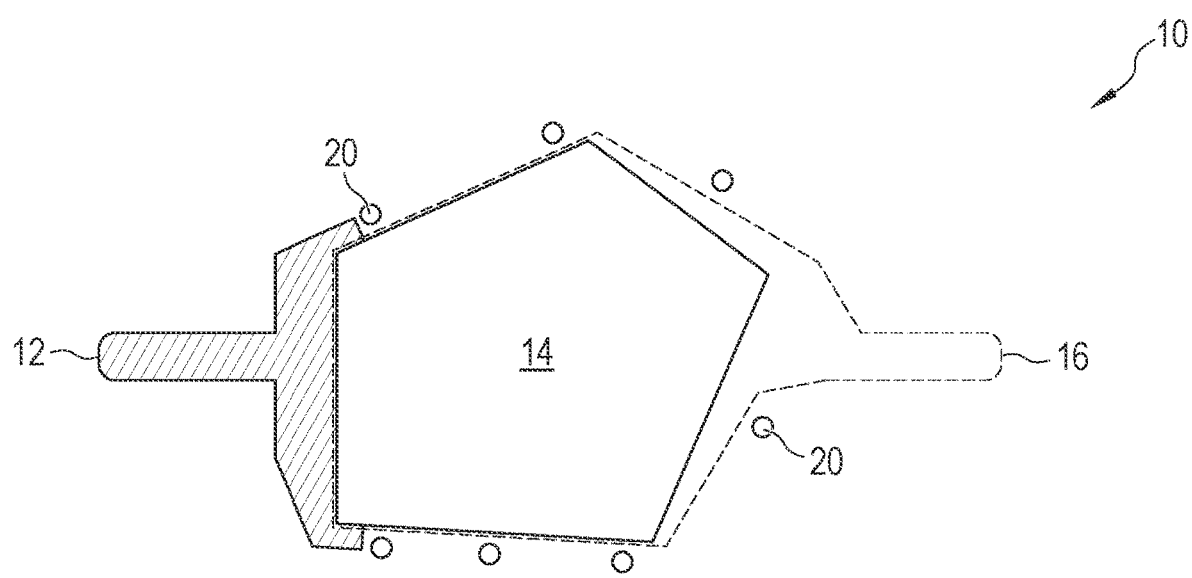
Figure 2:
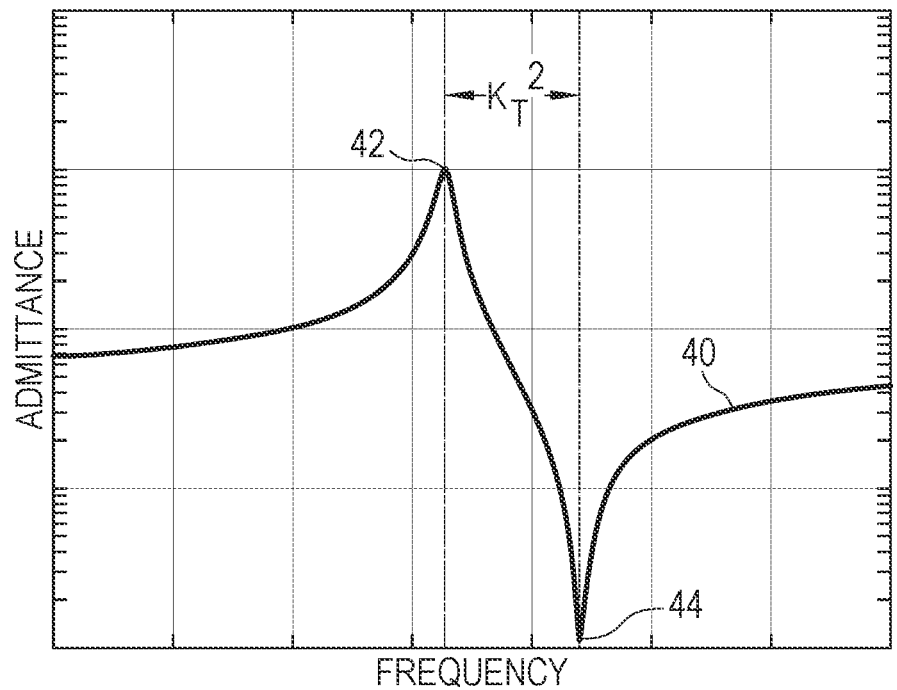
FIG. 2 is a graph of admittance versus frequency for the acoustic wave resonator in FIGS. 1a-1b.
Figure 3:
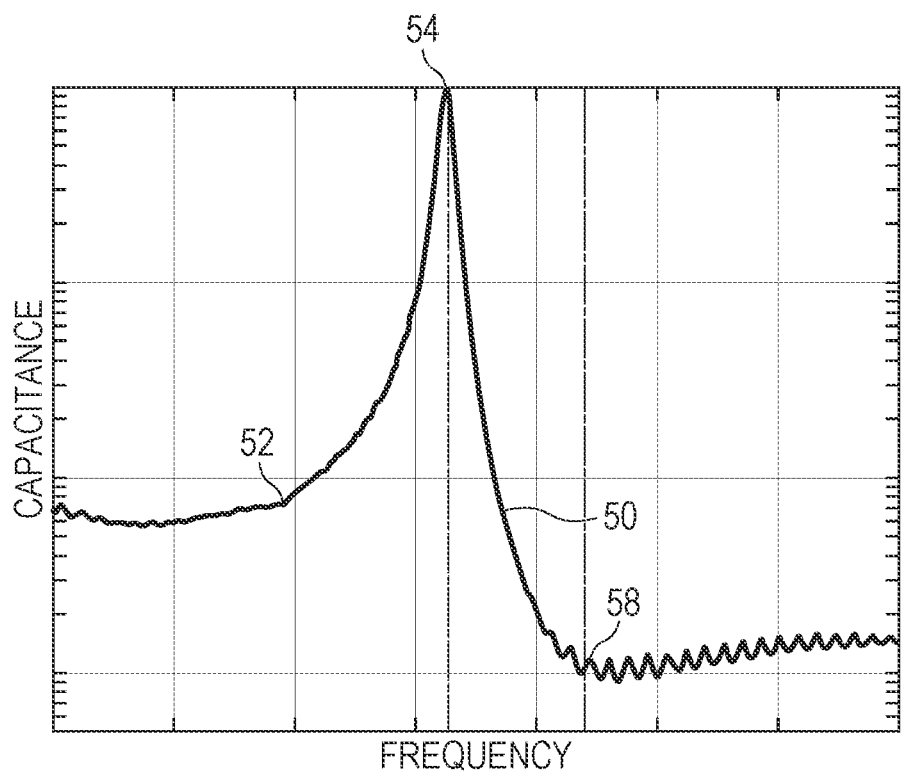
FIG. 3 is a graph of capacitance versus frequency for the acoustic wave resonator in FIGS. 1a-1b.
Figure 8:
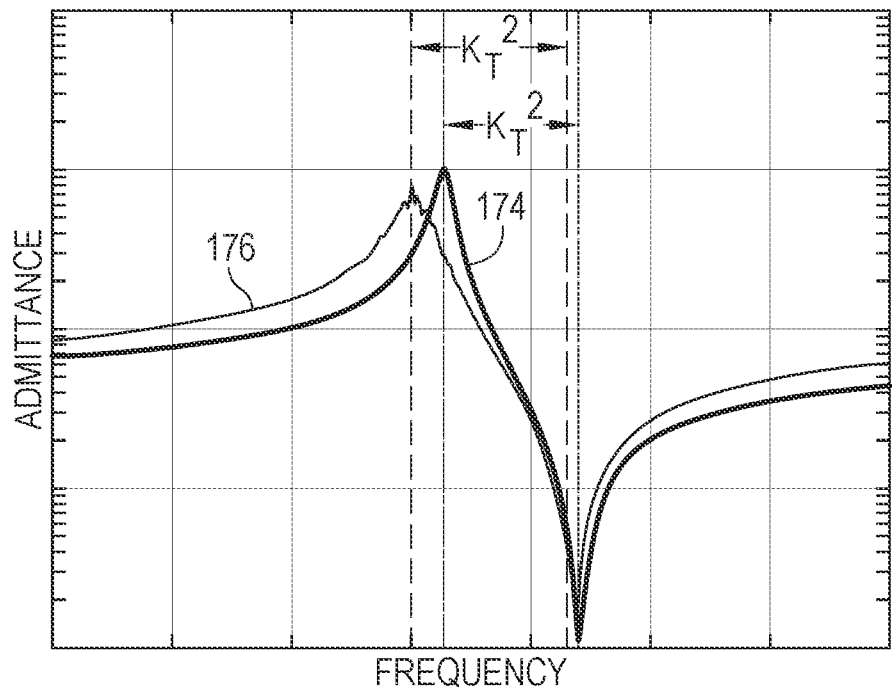
FIG. 8 is a graph of admittance versus frequency comparing the new and old acoustic wave resonators.
Figure 9:
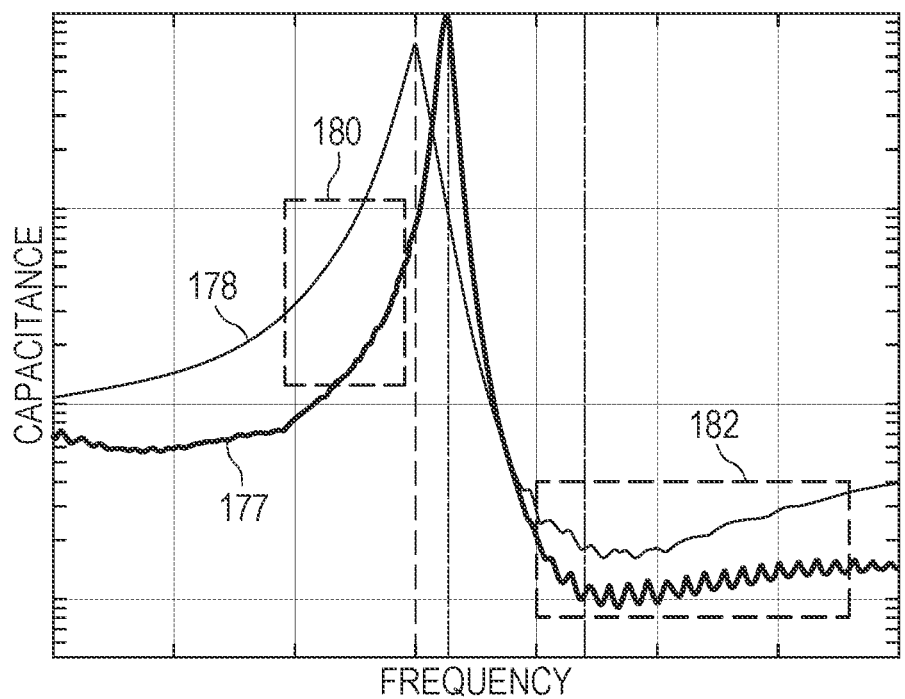
FIG. 9 is a graph of capacitance versus frequency comparing the new and old acoustic wave resonators.

The difference can be seen in FIG. 8 illustrating curve 175 from acoustic wave resonator 10 in FIGS. 1a-1b and curve 176 from acoustic wave resonator 140. $K_T^2$ of curve 176 is greater than $K_T^2$ of curve 175. Likewise, FIG. 9 shows curve 177 from acoustic wave resonator 10 in FIGS. 1a-1b and curve 178 from acoustic wave resonator 140. Spurious modes are less for curve 178, as seen in areas 180 and 182.

Figure 10A:
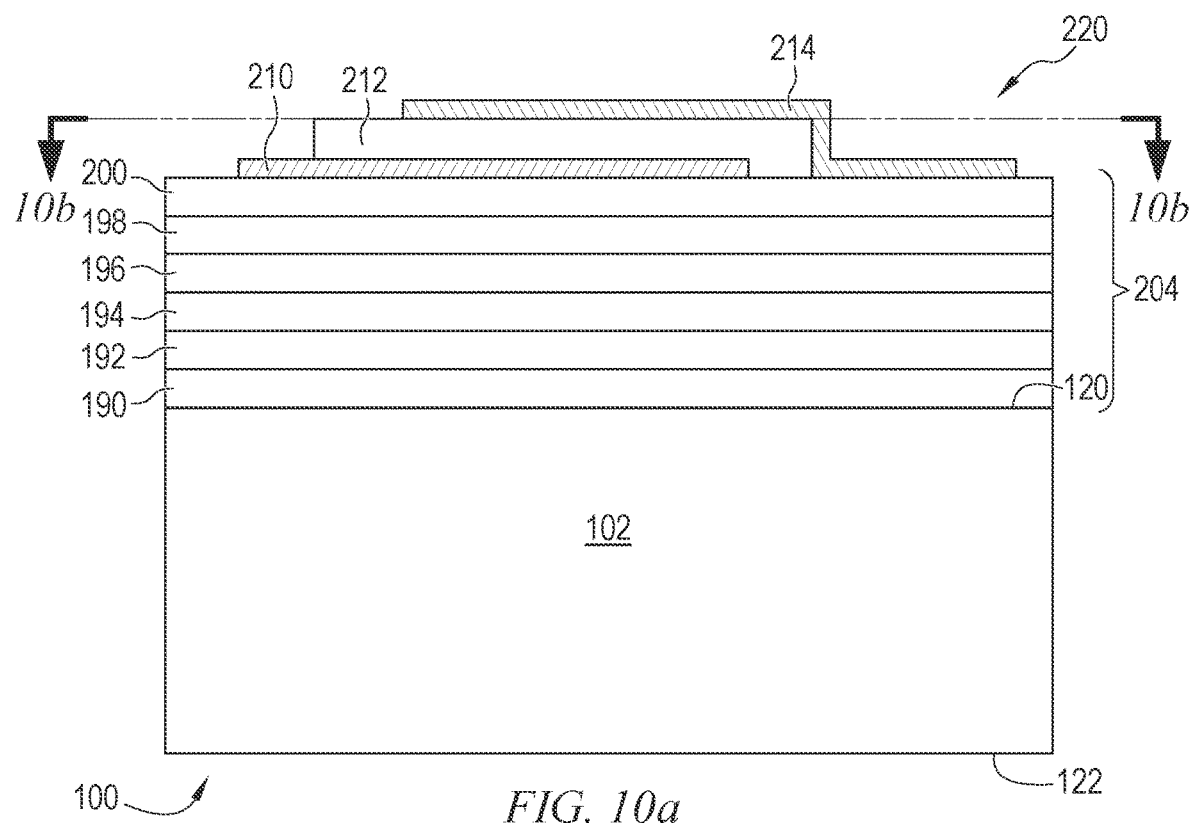
FIGS. 10a-10b illustrate an alternate embodiment of an acoustic wave resonator—the solidly mounted resonator SMR—with piezoelectrical material with a plurality of fractals to optimize the perimeter-to-area ratio.
Figure 10B:
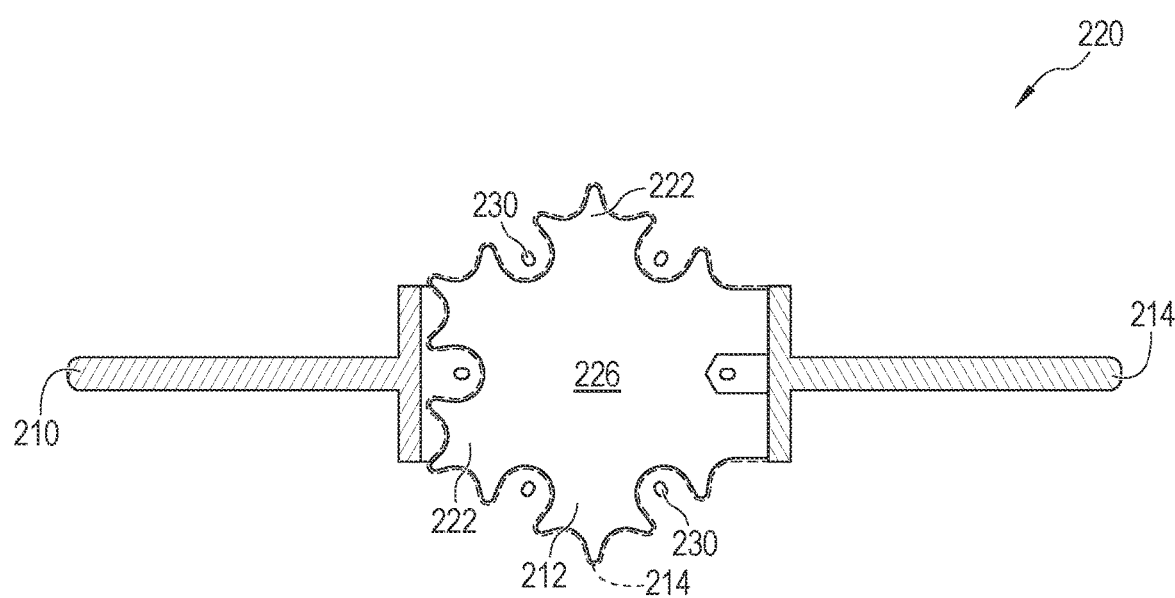

FIGS. 10a-10b illustrate an alternate embodiment of the acoustic wave resonator—a solidly mounted resonator SMR. An insulating or thin film layer 190 is formed over surface 120 of substrate 100 using PVD, CVD, printing, spin coating, spray coating, sintering or thermal oxidation. Thin film layer 190 contains one or more layers of SiO2, Si3N4, SiON, Ta2O5, Al2O3, or other material having similar structural and insulating properties. In a similar manner, thin film layer 192 is formed over thin film layer 190, thin film layer 194 is formed over thin film layer 192, thin film layer 196 is formed over thin film layer 194, thin film layer 198 is formed over thin film layer 196, and thin film layer 200 is formed over thin film layer 198. Thin film layers 190-200 form a Bragg reflector 204. Bragg reflector 204 includes a multilayer-stack of alternating high refractive index and low refractive index thin films 190-200, e.g., each one quarter wavelength in thickness. In one embodiment, thin film layers 190, 194, 198 are high refractive index, and thin film layers 192, 196, and 200 are low refractive index. Alternatively, thin film layers 190, 194, 198 are varying refractive index, albeit higher than, thin film layers 192, 196, and 200 also with varying refractive index.

An electrically conductive layer 210 is formed in contact with thin film layer 200 using PVD, CVD, evaporation, electrolytic plating, electroless plating process, or other suitable metal deposition process. Conductive layer 210 can be one or more layers of Al, Cu, Sn, Ni, Au, Ag, or other suitable electrically conductive material. Conductive layer 210 operates as a contact for acoustic wave resonator 220.

A piezoelectric material 212 is formed over conductive layer 210 and thin film 200 using PVD, CVD, sputtering, or other suitable deposition process. Piezoelectric material 212 contains one or more layers of aluminum or aluminium nitride, zinc oxide, lead zirconate titanate, quartz, gallium arsenide, lithium niobate, or any other reactive material with similar physical and electrical properties. In one embodiment, piezoelectric material 212 is deposited as a thin film, followed by an anneal.

An electrically conductive layer 214 is formed in contact with piezoelectric material 212 and thin film 200 using PVD, CVD, evaporation, electrolytic plating, electroless plating process, or other suitable metal deposition process. Conductive layer 214 can be one or more layers of Al, Cu, Sn, Ni, Au, Ag, or other suitable electrically conductive material. The combination of conductive layer 210, piezoelectric material 212, and conductive layer 214 operate as acoustic wave resonator 220 converting an electrical signal to a mechanical activity or signal, or mechanical activity or signal to an electrical signal. In one embodiment, as shown in FIG. 10a, acoustic wave resonator 220 is a solid-mounted BAW resonator. Conductive layer 214 operates as a contact for acoustic wave resonator 220.

FIG. 10b is a top view of acoustic wave resonator 220. The external contact for conductive layer 210 enters from the left and extends under piezoelectric material 212. The external contact for top conductive layer 214 enters from the right and extends over piezoelectric material 212. The portion of top conductive layer 214 over piezoelectric material 212 is hidden to show the relevant physical shape of the piezoelectric material. The active portion of acoustic wave resonator 220 is the area where conductive layer 210, piezoelectric material 212, and conductive layer 214 all overlap in vertical alignment.

In particular, piezoelectric material 212 is shown with fractal shapes 222 around central body region 226 to increase or maximize the perimeter-to-area ratio of the active portion of acoustic wave resonator 220. Fractals 222 extend from central body region 226 and can have a variety of shapes, each shape intending to optimize the perimeter-to-area ratio of the active portion of acoustic wave resonator 140 to enhance its performance by maximizing $K_T^2$ and Q. For example, fractals 222 can be star-shaped, pointed-extensions, rounded-extensions, leaf-shaped, etc., including any embodiment from FIGS. 7a-7d or as described herein. Fractals 222 can vary in geometry, angle, shape, size, form, area, and ratio of fractal area to core area. A perspective view of fractal 222 is similar to FIG. 6b.

In one embodiment, the active portion of acoustic wave resonator 140 has, including but not limited to, a perimeter of 2112 μm as the distance around each feature or pattern of fractals 222 and core area 226, and similar area as piezoelectric material 14, as described in the background. The perimeter of active portion of acoustic wave resonator 140 is greater and the area is similar, as compared to piezoelectrical material 14. Consequently, the perimeter-to-area ratio of the active portion of acoustic wave resonator 220 has optimized, i.e., increased or decreased, to maximize $K_T^2$ and Q. The greater perimeter-to-area ratio of the active portion of acoustic wave resonator 220, the greater $K_T^2$, higher Q, less spurious resonances, which improves the operational efficiency of acoustic wave resonator 220, see FIGS. 8 and 9.

The enhanced performance of acoustic wave resonator 220 (in part, maximizing $K_T^2$ and Q) can be achieved by patterning conductive layer 210, piezoelectric material 212, and/or conductive layer 214 with fractals 222. By nature of the active portion of acoustic wave resonator 140 being the area where conductive layer 210, piezoelectric material 212, and conductive layer 138 214 overlap in vertical alignment, fractals 222 can be patterned in conductive layer 210, or conductive layer 214, or piezoelectric material 212, or any combination of these layers, including all three layers.

Figure 11A:
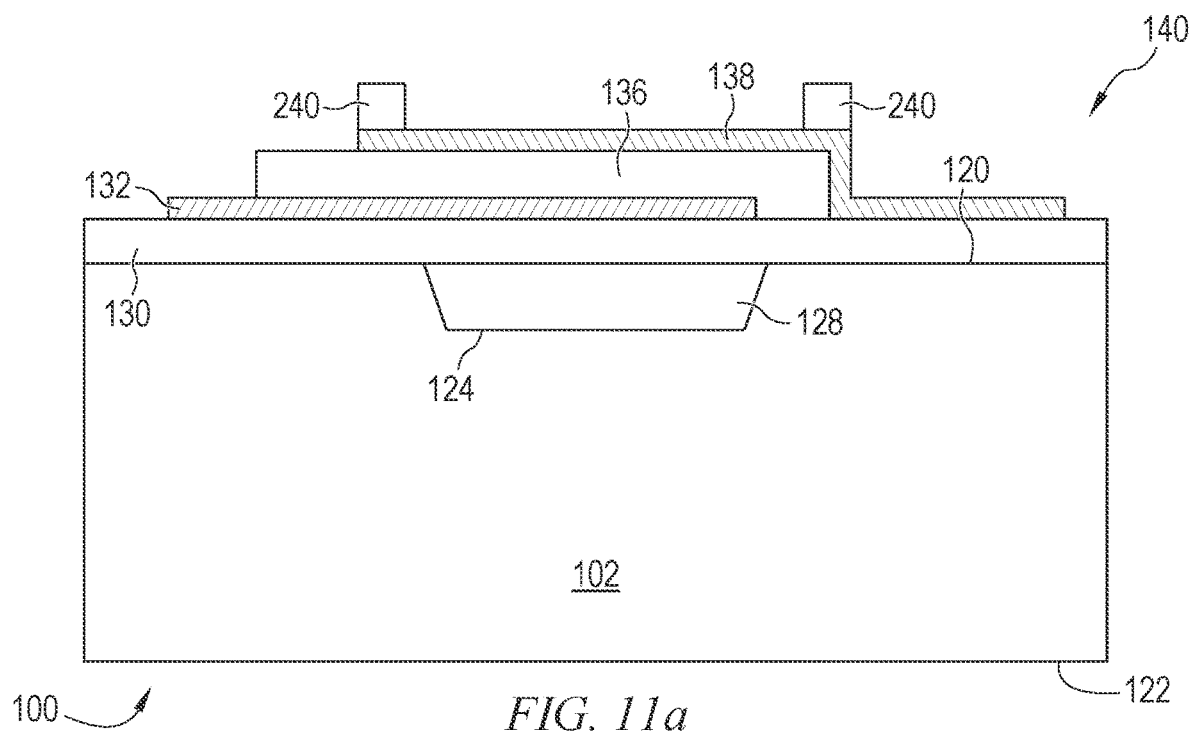
FIGS. 11a-11f illustrate a frame disposed over or within the piezoelectrical material.
Figure 11B:
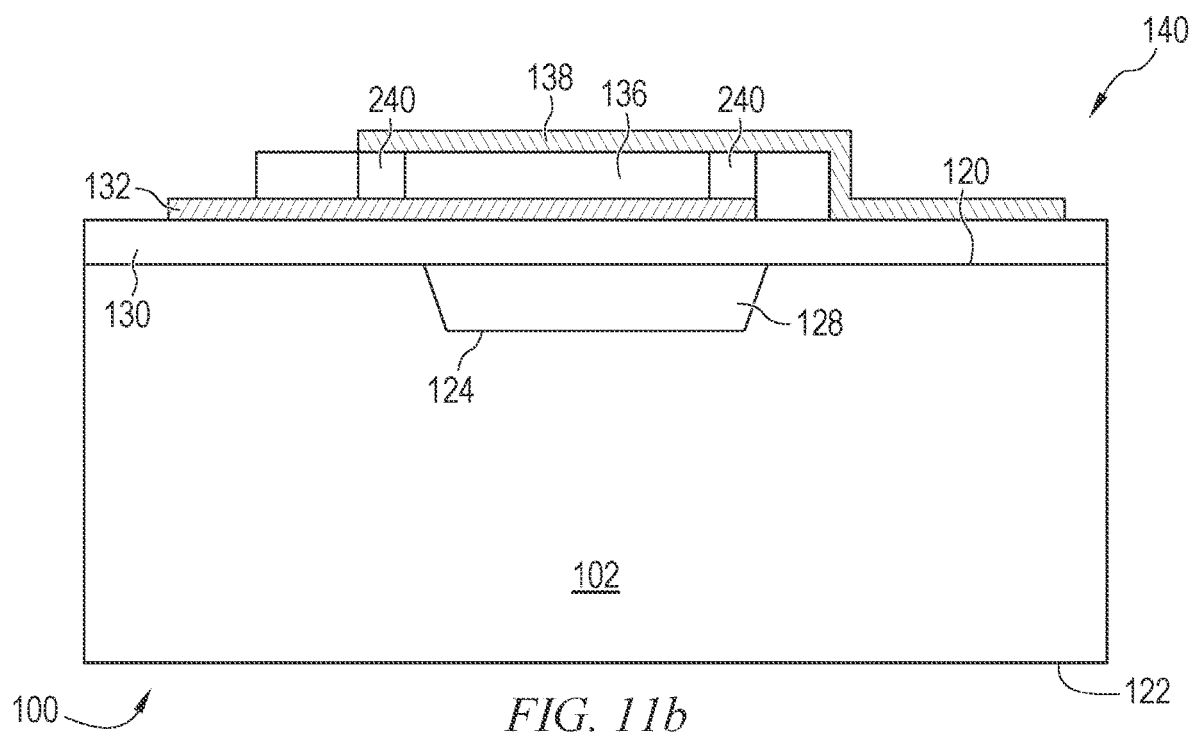
Figure 11C:
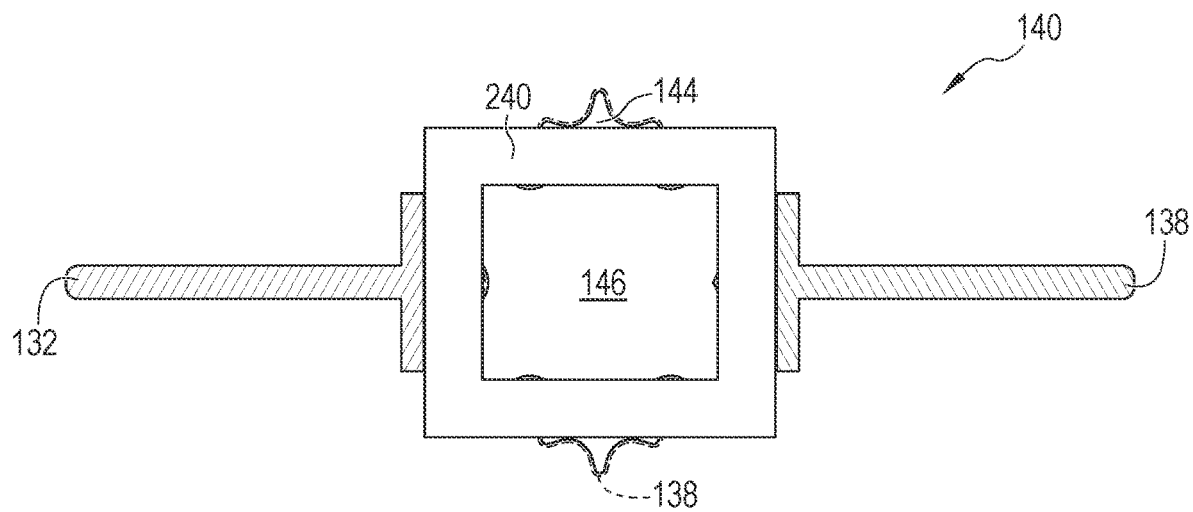
Figure 11D:
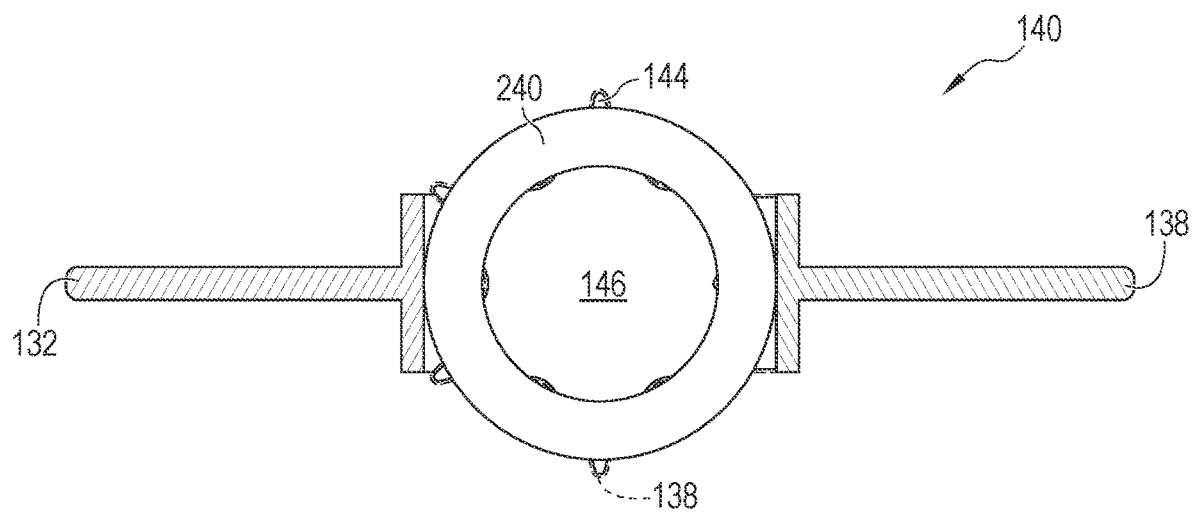
Figure 11E:
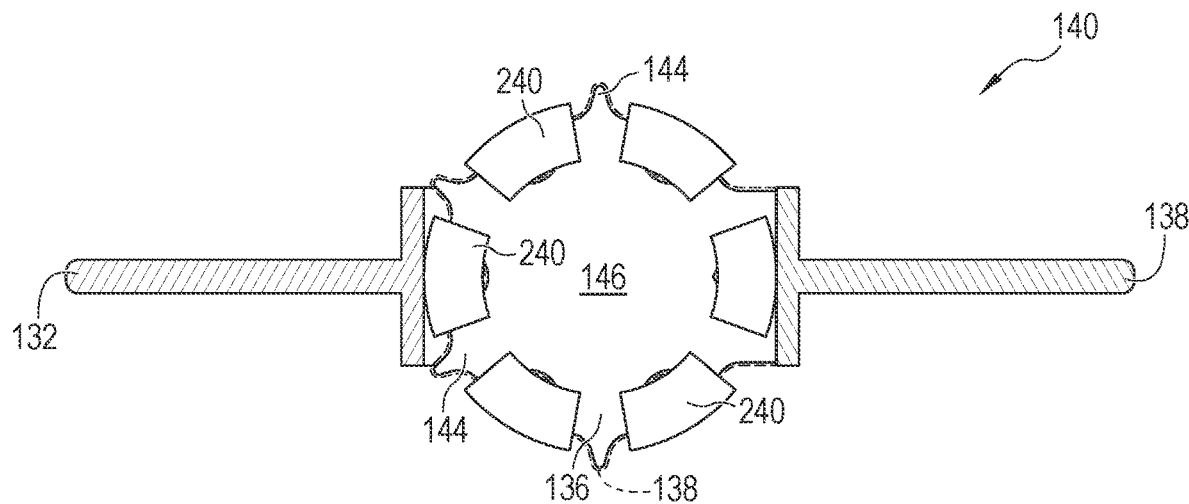
Figure 11F:
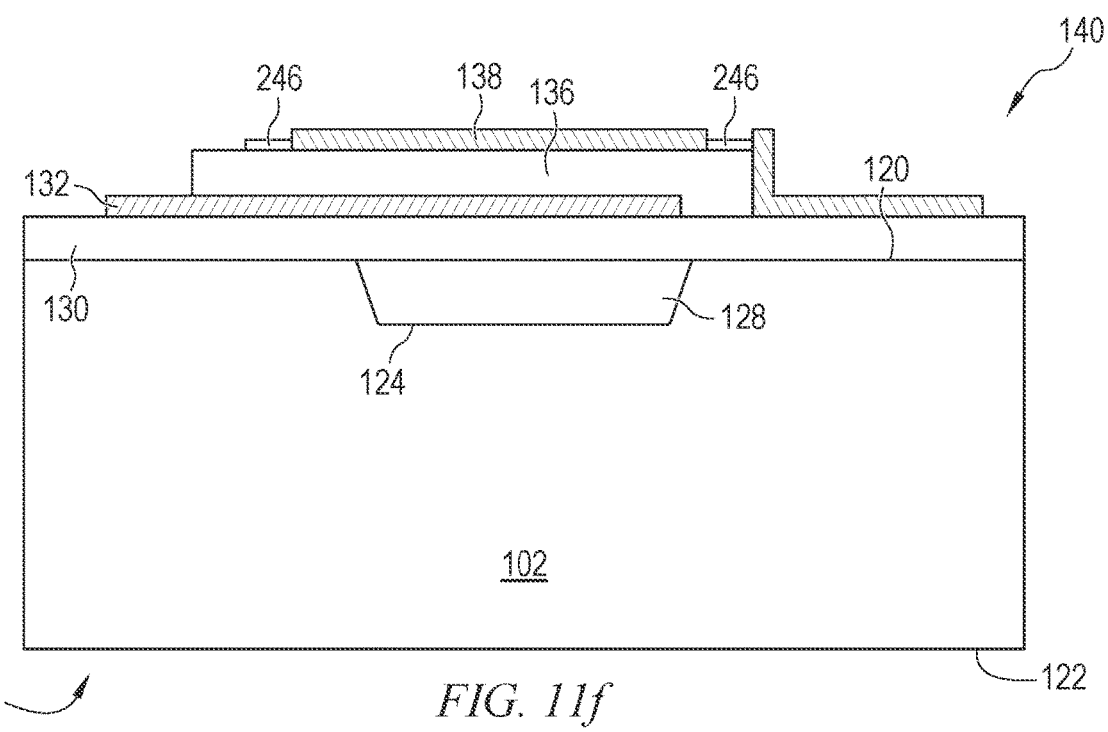

FIGS. 11a-11f illustrates a frame formed over acoustic wave resonator 140. Continuing from FIGS. 5e-6a, frame 240 is formed over conductive layer 138, as shown in FIG. 11a, or within piezoelectric material 136, as shown in FIG. 11b. Frame 240 can be made with one or more layers of Al, Cu, Sn, Ni, Au, Ag, or other suitable electrically conductive material. Frame 240 is raised above conductive layer 138. FIG. 11c is a top view of frame 240 showing the frame with a rectangular shape. Alternatively, frame 240 can be circular, as shown in FIG. 11d, or other geometric shape, e.g., serpentine, oval, sloping angled, etc. Frame 240 can be discontinuous as shown in FIG. 11e. In FIG. 11f, frame 246 is recessed below the upper surface of conductive layer 138. In yet another embodiment, frame 240 or 246 can be a combination of raised portions and recessed portions.

Frame 240 or 246 surrounds the active region of piezoelectric material 136, i.e., the area overlapped by conductive layers 132 and 138. Frame 240 or 246 reflects incident wave energy back toward the active region of piezoelectric material 136. Frame 240 or 246 confines acoustic energy of the main resonant mode in the active region to achieve high Q-factor resonator, while suppressing lateral and spurious modes. Acoustic energy confinement is based on an energy trapping principle. When a portion of the wafer surrounding the resonator has a cutoff frequency higher than the exciting frequency, the resulting vibratory energy is essentially confined to the resonator with an energy distribution decreasing exponentially with distance away from the resonator. The exponential decay is not associated with energy loss but acts to trap the oscillating energy within a confined region. Based on the type of the resonator and its dispersion characteristics, the raised or recessed frame are used to have frequency lower or higher than the main resonance frequency to confine the acoustic wave energy. Also, using a combination of raised and recessed frame may assist with confining the acoustic energy and suppressing the lateral modes.

Figure 12:
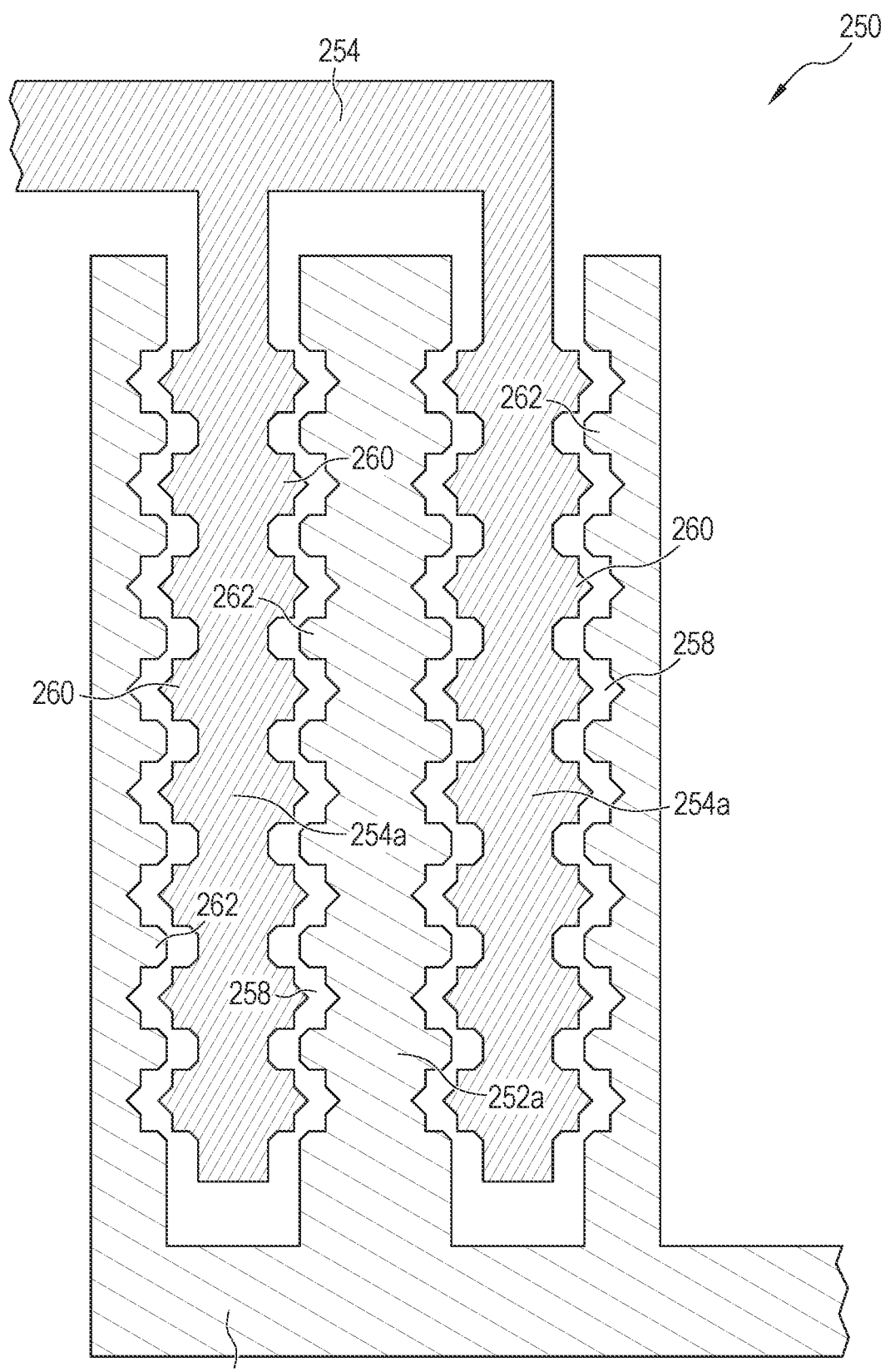
FIG. 12 illustrates a surface acoustic wave resonator having piezoelectrical material with a plurality of fractals to optimize the perimeter-to-area ratio.

FIG. 12 illustrates the use of fractals with SAW resonator 250. Conductive layer 252 includes a plurality of leads or fingers 252a. Conductive layer 254 includes a plurality of leads or fingers 254a interdigitated with leads 252a. Piezoelectric material 258 is disposed between leads 252a and leads 254a. The active portion of SAW resonator 250 is the area where conductive layer 252, piezoelectric material 258, and conductive layer 254 are all in horizontal alignment. Accordingly, conductive leads 252a, conductive leads 254a, and piezoelectric material 258 all include fractals 260 and 262 to optimize the perimeter-to-area ratio of the active region of SAW resonator 250, i.e., increased or decreased, to maximize $K_T^2$ and Q.

SAW resonator 250 operates on the principle of exciting surface acoustic wave at the interface of conductive layers 252 and 254 and piezoelectric material 258. Conductive layers 252 and 254 and, in particular, conductive leads 252a and 254a, are configured as an interdigital transducer (IDT). The excitation frequency of the surface acoustic wave is dependent on the distance (wavelength) between the two IDT's. The surface acoustic waves which can be excited based on the IDT's configuration and piezo material, such as the Rayleigh wave, Love wave, Sezawa wave, and Leaky longitudinal wave.

SAW resonator 250 can be improved by selecting an optimal cut angle of piezoelectric material 258 to achieve high coupling coefficient, appropriate power flow angle and frequency-temperature characteristics. Fractals 260, 262 extend through the thickness of conductive layers 252 and 254 and piezoelectric material 258. The selection of conductive layer material and optimizing its thickness as function of wavelength is useful for the resonator's power handling capability. Different configuration of IDTs, such apodization, chirp, and hammer head, to confine the surface acoustic wave to achieve high Q-factor. Temperature compensation layer between the IDT's and piezoelectric material can achieve low temperature coefficient of frequency for the surface acoustic wave resonator. The selection of an appropriate passivation layer material and its thickness suppresses spurious modes in the vicinity of main resonance. An interfacial layer between conductive layers 252, 254 and piezoelectric material 258 provides a high Q to further improve the Q-factor (I.H.P. SAW).

Other improvements proposed using fractals for SAW resonators included optimal placement of fractals 260, 262 along the IDT's could help to suppress the spurious modes, and optimal fractal size located at the center of the SAW resonator could help to confine the surface acoustic wave energy at the center and improve Q-factor. Fractals 260, 262 placed between the IDT's improve reflection of the main surface acoustic wave and further improve the Q-factor.

While one or more embodiments of the present invention have been illustrated in detail, the skilled artisan will appreciate that modifications and adaptations to those embodiments may be made without departing from the scope of the present invention as set forth in the following claims.

What is claimed:

1. A resonator, comprising:
   a first conductive layer;
   a piezoelectric material formed over the first conductive layer; and
   a second conductive layer formed over the piezoelectric material, wherein an alignment of the first conductive layer, piezoelectric material and second conductive area defines an active region of the resonator with a plurality of fractals extending through at least the second conductive layer and piezoelectric material.

2. The resonator of claim 1, wherein the plurality of fractals maximizes a perimeter-to-area ratio of the active region of the resonator.

3. The resonator of claim 1, wherein the plurality of fractals increases electromechanical coupling and a quality factor of the resonator.

4. The resonator of claim 1, wherein the plurality of fractals includes a star shape, rounded shape, asymmetric shape, or other shape that optimizes the perimeter-to-area ratio of the active region to maximize performance of the resonator.

5. The resonator of claim 1, further including a frame disposed over or within the piezoelectric material.

6. The resonator of claim 5, wherein the frame is raised above the second conductive layer or recessed below the second conductive layer.

7. A resonator, comprising an active region, wherein the active region includes a core area and a plurality of fractals extending through the core area that optimizes the perimeter-to-area ratio of the active region to maximize performance of the resonator.

8. The resonator of claim 7, wherein the plurality of fractals increases a quality factor of the resonator.

9. The resonator of claim 7, wherein the plurality of fractals includes a star shape, rounded shape, or asymmetric shape.

10. The resonator of claim 7, further including a frame disposed over or within the active region of the resonator.

11. The resonator of claim 10, wherein the frame is raised above the active region or recessed below the active region.

12. The resonator of claim 7, wherein the resonator is a surface acoustic wave resonator or bulk acoustic wave resonator.

13. A resonator, comprising an active region, wherein the active region includes a core area and a plurality of fractals extending from or recessed into the core area that optimizes the perimeter-to-area ratio of the active region to maximize performance of the resonator and the plurality of fractals increases electromechanical coupling of the resonator.

14. A method of making a resonator, comprising:
providing a first conductive layer;
forming a piezoelectric material over the first conductive layer; and
forming a second conductive layer over the piezoelectric material, wherein an alignment of the first conductive layer, piezoelectric material and second conductive area define an active region of the resonator with a plurality of fractals extending through at least the second conductive layer and piezoelectric material.

15. The method of claim 14, wherein the plurality of fractals optimizes a perimeter-to-area ratio of the active region.

16. The method of claim 14, wherein the plurality of fractals increases electromechanical coupling and a quality factor of the resonator.

17. The method of claim 14, wherein the plurality of fractals includes a star shape, rounded shape, asymmetric shape.

18. The method of claim 14, further including disposing a frame over or within the piezoelectric material.

19. The resonator of claim 18, wherein the frame is raised above the second conductive layer or recessed below the second conductive layer.

20. The method of claim 14, wherein the resonator is a surface acoustic wave resonator or bulk acoustic wave resonator.

* * * * *